US010761192B2

(12) United States Patent
Bakin et al.

(10) Patent No.: US 10,761,192 B2
(45) Date of Patent: Sep. 1, 2020

(54) ILLUMINATION MODULES FOR TRANSLATING LIGHT

(71) Applicant: ams Sensors Singapore Pte. Ltd., Singapore (SG)

(72) Inventors: Dmitry Bakin, San Jose, CA (US); Moshe Doron, San Francisco, CA (US); Matthias Gloor, Boswil (CH); Markus Rossi, Jona (CH)

(73) Assignee: ams Sensors Singapore Pte. Ltd., Singapore (SG)

(*) Notice: Subject to any disclaimer, the term of this patent is extended or adjusted under 35 U.S.C. 154(b) by 331 days.

(21) Appl. No.: 15/755,269

(22) PCT Filed: Aug. 25, 2016

(86) PCT No.: PCT/SG2016/050412
§ 371 (c)(1),
(2) Date: Feb. 26, 2018

(87) PCT Pub. No.: WO2017/039536
PCT Pub. Date: Mar. 9, 2017

(65) Prior Publication Data
US 2018/0252799 A1    Sep. 6, 2018

Related U.S. Application Data

(60) Provisional application No. 62/211,528, filed on Aug. 28, 2015.

(51) Int. Cl.
G01C 3/08       (2006.01)
G01S 7/481      (2006.01)
(Continued)

(52) U.S. Cl.
CPC ............ G01S 7/4815 (2013.01); G01S 17/32 (2013.01); G02B 19/0028 (2013.01);
(Continued)

(58) Field of Classification Search
None
See application file for complete search history.

(56) References Cited

U.S. PATENT DOCUMENTS 8,675,706 B2    3/2014 Seurin et al.
8,783,893 B1    7/2014 Seurin et al.
(Continued)

FOREIGN PATENT DOCUMENTS

CN    101382247 A    3/2009
CN    101382657 A    3/2009
(Continued)

OTHER PUBLICATIONS

ISA/AU, International Search Report for PCT/SG2016/050412 (dated Nov. 11, 2016).

(Continued)

Primary Examiner — Isam A Alsomiri
Assistant Examiner — Amir J Askarian
(74) Attorney, Agent, or Firm — Michael Best and Friedrich LLP

(57) ABSTRACT

This disclosure relates to illumination modules operable to increase the area over which an illumination source, such as a vertical-cavity surface-emitting laser or light-emitting diode, illuminates. Such illumination modules include a substrate having electrical contacts, an illumination source electrically connected to the substrate, a collimation assembly operable to collimate the light generated from the illumination source, a translation assembly operable to translate light over an area, and a mask assembly. In various implementations the illumination source may be rather small in area, thereby reducing the cost of the illumination module. Some implementations of the illumination module can be used for the acquisition of three-dimensional data in some cases, while in other cases some implementations of the (Continued)

illumination module can be used for other applications requiring projected light.

23 Claims, 7 Drawing Sheets

(51) Int. Cl.
    *G02B 19/00*     (2006.01)
    *G01S 17/32*     (2020.01)
    *H01S 5/00*     (2006.01)
    *H01S 5/022*     (2006.01)
    *H01L 33/60*     (2010.01)
    *H01L 33/58*     (2010.01)
    *G02B 3/00*     (2006.01)
    *H01S 5/42*     (2006.01)

(52) U.S. Cl.
    CPC ..... *G02B 19/0061* (2013.01); *G02B 19/0066* (2013.01); *H01L 33/58* (2013.01); *H01L 33/60* (2013.01); *H01S 5/005* (2013.01); *H01S 5/02292* (2013.01); *G02B 3/0056* (2013.01); *H01L 2224/48091* (2013.01); *H01S 5/02296* (2013.01); *H01S 5/423* (2013.01)

(56) References Cited

U.S. PATENT DOCUMENTS

| | | | |
|---|---|---|---|
| 9,507,143 B2* | 11/2016 | Abele | H01L 33/60 |
| 9,553,423 B2* | 1/2017 | Chen | H04N 13/254 |
| 10,533,730 B2* | 1/2020 | Harrold | G02B 19/0066 |
| 2005/0254233 A1 | 11/2005 | Alessio | |
| 2007/0091470 A1 | 4/2007 | Saito | |
| 2009/0067186 A1 | 3/2009 | Futami | |
| 2011/0037953 A1 | 2/2011 | Nizani et al. | |
| 2013/0044187 A1 | 2/2013 | Hammes et al. | |
| 2013/0182441 A1 | 7/2013 | Nemeyer | |
| 2014/0071404 A1 | 3/2014 | Davidson | |
| 2014/0146554 A1 | 5/2014 | Giraud | |
| 2014/0168780 A1 | 6/2014 | Lee et al. | |
| 2016/0349414 A1 | 12/2016 | Rudmann et al. | |
| 2017/0108699 A1 | 4/2017 | Perez Calero et al. | |
| 2017/0139178 A1 | 5/2017 | Rossi et al. | |
| 2017/0322424 A1 | 11/2017 | Rossi | |
| 2019/0316759 A1* | 10/2019 | Harrold | F21K 9/90 |

FOREIGN PATENT DOCUMENTS

| | | |
|---|---|---|
| CN | 102494299 A | 6/2012 |
| CN | 103292232 A | 9/2013 |
| CN | 103591522 A | 2/2014 |
| CN | 103851542 A | 6/2014 |

OTHER PUBLICATIONS

Translation of the National Intellectual Property Administration of the People's Republic of China First Office Action for Application No. 201680054545.8 dated May 31, 2019 (8 pages).

* cited by examiner

ILLUMINATION MODULES FOR TRANSLATING LIGHT

FIELD OF THE DISCLOSURE

This disclosure relates to illumination modules that include optical assemblies.

BACKGROUND

Mobile devices often contain optoelectronic modules with corresponding illumination sources. In general, there is significant pressure to reduce the cost of such optoelectronic modules. Their cost is often related to the area over which the illumination source is implemented. For example, a vertical-cavity surface-emitting laser (VCSEL) array is implemented on a chip, the chip having a particular diameter. In order to increase the illumination area of the VCSEL array, or rather to increase the area over which the VCSEL illuminates, the VCSEL chip diameter is increased. The cost, however, of such a diameter increase may be prohibitively expensive.

SUMMARY

This disclosure describes illumination modules that increase the area over which an illumination source illuminates without increasing the diameter of the illumination source. In one aspect, for example, an illumination module includes a substrate having electrical contacts, an illumination source electrically connected to the substrate. The illumination source is operable to generate light of a particular range of wavelengths in this example, where the light has a first intensity distribution that laterally extends over a first illumination area. The first illumination area and the first intensity distribution define a first centroid. This example further includes an illumination axis that intersects the first centroid of the first illumination area. The illumination axis is substantially orthogonal to the first illumination area. This implementation further includes a collimation assembly operable to collimate the light generated from the illumination source. The collimation assembly transmits a collimated light. The collimated light is incident on a translation assembly. The translation assembly is operable to translate the collimated light. The translation assembly transmits a translated light, where the translated light has a second intensity distribution that laterally extends over a second illumination area. The second illumination area and the second intensity distribution define a second centroid. This implementation further includes a mask assembly. The mask assembly is operable to transmit the translated light. The mask assembly transmits a mask light having a having a third intensity distribution that laterally extends over a third illumination area. The third illumination area and the third intensity distribution define a third centroid. Further, the collimation assembly, the translation assembly, and the mask assembly are mounted within a housing and aligned with the illumination axis. In this implementation the collimation assembly and the translation assembly are optically disposed between the illumination source and the mask assembly, and the second illumination area is greater than the first illumination area.

In another aspect, for example, an illumination module includes a substrate having electrical contacts, an illumination source electrically connected to the substrate. The illumination source is operable to generate light of a particular range of wavelengths. The light has a first intensity distribution that laterally extends over a first illumination area. The first illumination area and the first intensity distribution define a first centroid. An illumination axis intersects the first centroid of the first illumination area, where the illumination axis is substantially orthogonal to the first illumination area in this implementation. The illumination module further includes a translation assembly, operable to translate the light generated from the illumination source, where the translation assembly transmits a translated light. The illumination module further includes a collimation assembly operable to collimate the translated light. The collimation assembly transmits a collimated light, where the collimated light has a second intensity distribution that laterally extends over a second illumination area. The second illumination area and the second intensity distribution define a second centroid. This implementation further includes a mask assembly. The mask assembly is operable to transmit the translated light, where the mask assembly transmits a mask light. The mask light has a third intensity distribution laterally extending over a third illumination area; the third illumination area and the third intensity distribution define a third centroid. In this implementation, the collimation assembly, the translation assembly, and the mask assembly are mounted within a housing and aligned with the illumination axis. The collimation assembly and the translation assembly are optically disposed between the illumination source and the mask assembly. Further, the second illumination area is greater than the first illumination area.

In another aspect, for example, a mask assembly includes a mask substrate. The mask substrate has a first surface and a second surface. The mask substrate is substantially transparent to light of a particular range of wavelengths. The mask assembly further includes a mask layer, the mask layer has a mask surface in contact with the first surface of the mask substrate. The mask surface defines a plurality of first mask-layer regions, where each first mask-layer region is substantially non-transparent to the particular range of wavelengths. Further, the mask surface defines a plurality of second mask-layer regions, where each second mask-layer regions is substantially transparent to the particular range of wavelengths. The first mask-layer regions are substantially reflective to the particular range of wavelengths. The illumination module in this implementation further includes a reflection layer. The reflection layer has a first reflection surface in contact with the second surface of the mask substrate and a second reflection surface. The first reflection surface defines a plurality of first reflection-layer regions, where each of the first reflection-layer regions is substantially non-transparent to the particular range of wavelengths. Further the first reflection surface defines a plurality of second reflection-layer regions, where each second reflection-layer region is substantially transparent to the particular range of wavelengths. The reflection surface defining the plurality of first reflection-layer regions is substantially reflective to the particular range of wavelengths.

In another aspect, for example, a translation assembly includes a translation assembly substrate having a first translation assembly substrate surface and a second translation assembly substrate surface. The translation assembly substrate is substantially transparent to the light of the particular wavelength generated by the illumination source. The translation assembly in this implementation further includes a plurality of first reflective elements mounted on the second translation assembly substrate surface, where each first reflective element within the plurality of first reflective elements includes a respective first reflective surface. This implementation further includes a plurality of second reflective elements, wherein each second reflective element within the plurality of second reflective elements includes a respective second reflective surface. The light of the particular wavelength generated by the illumination source is incident on the plurality of first reflective elements. The light incident on the plurality of first reflective elements generates a first reflected light that reflects from the second reflective elements, thereby generating a second reflected light.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural changes may be made without departing from the scope of the present invention. Accordingly, various modifications may be made within the spirit of the invention. Thus, other implementations are within the scope of the claims.

DETAILED DESCRIPTION

Figure 1A:
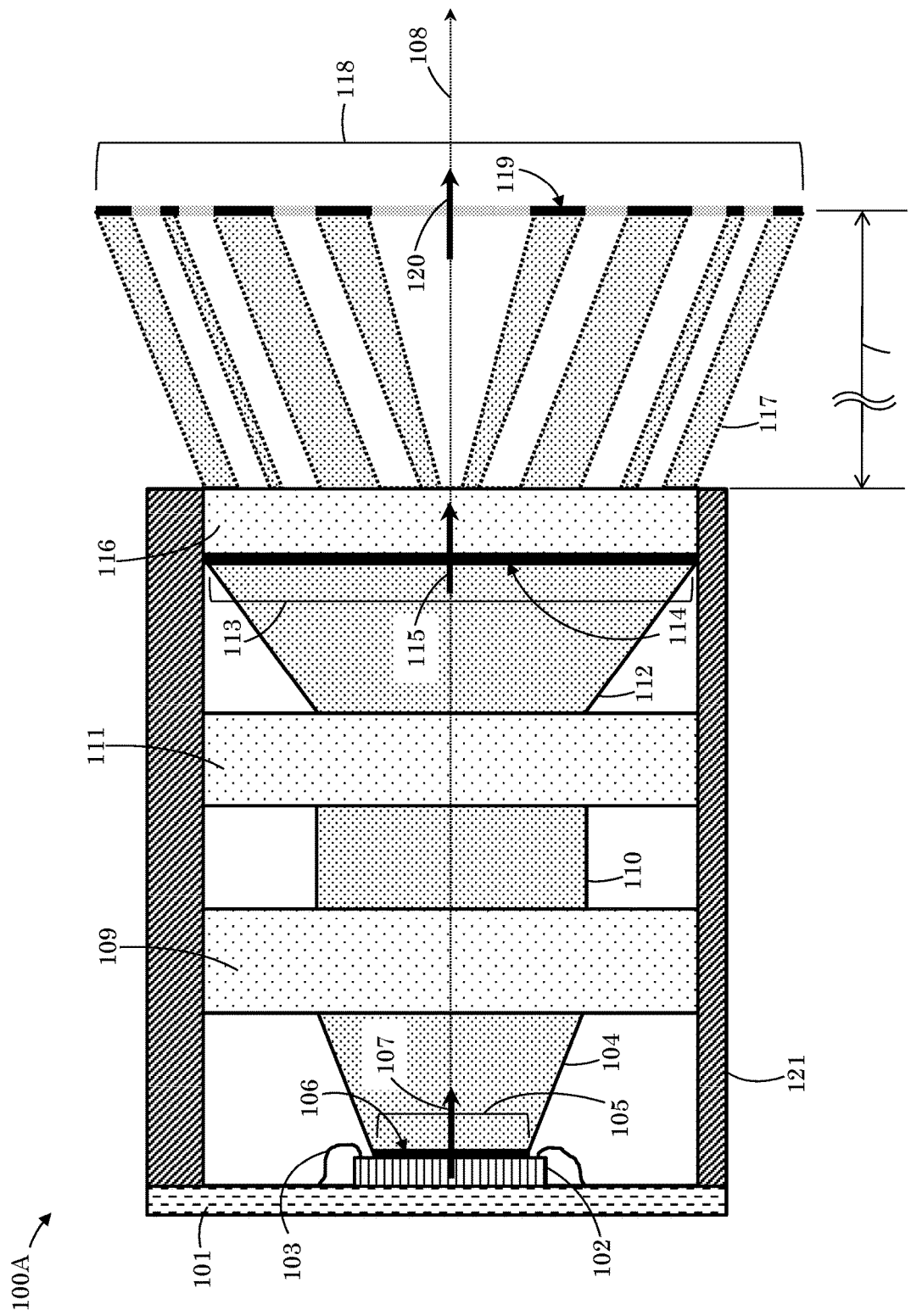
FIGS. 1A-1B depict two example illumination modules operable to increase the area over which an illumination source illuminates.
Figure 1B:
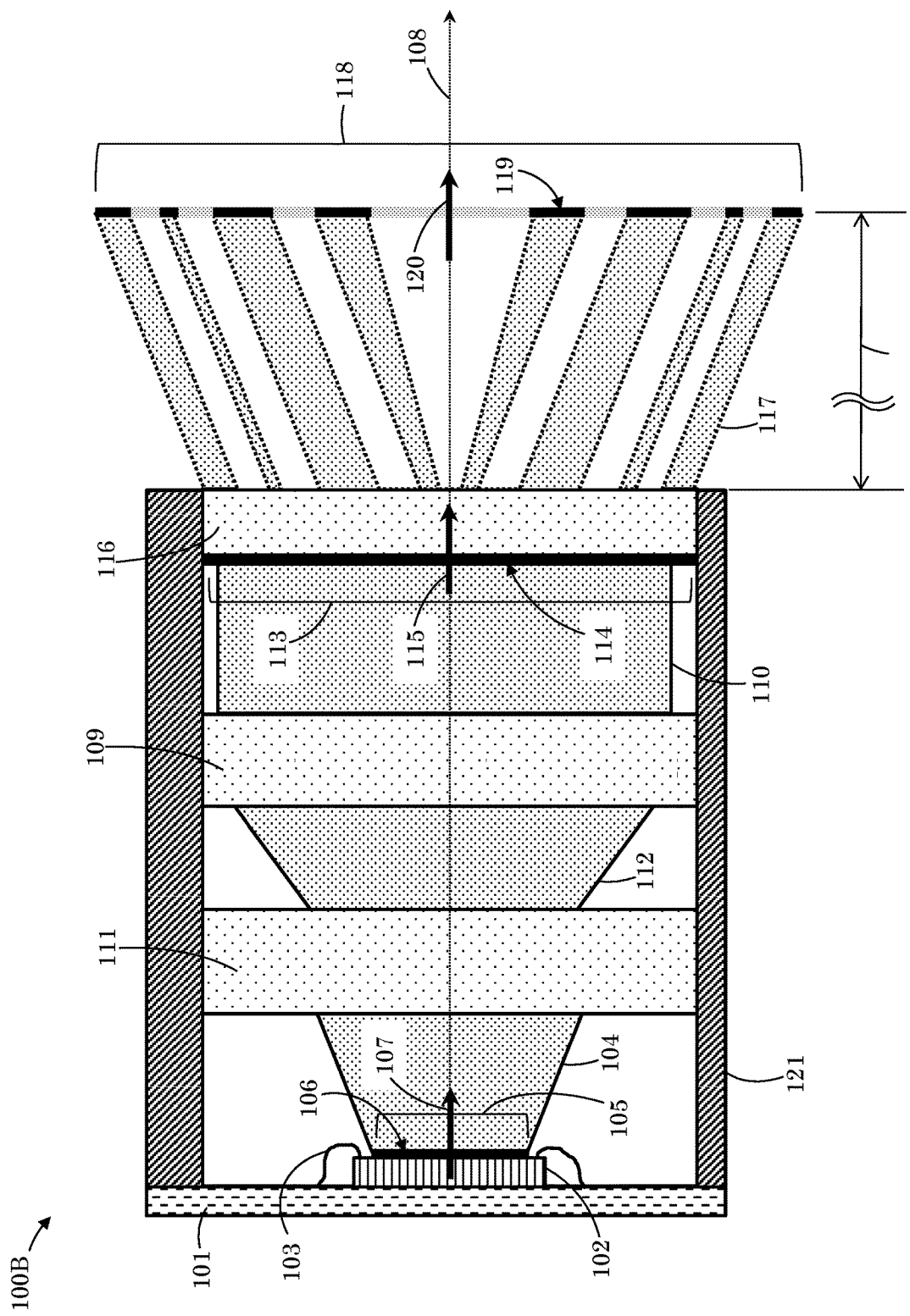

FIGS. 1A-1B depict two example illumination modules operable to increase the area over which an illumination source illuminates. FIG. 1A depicts an illumination module 100A. The illumination module 100A includes a substrate 101 (such as a PCB) and an illumination source 102 (e.g., a light-emitting diode, a laser, a vertical-cavity surface-emitting laser, and/or an array of any of the aforementioned example light sources). The illumination source can be electrically contacted to the substrate 101 via electrical contacts 103 (e.g., wires, vias, solder bumps). The illumination source 102 can emit light of a particular range of wavelengths 104 (e.g., light that is not perceptible by human beings such as infrared light). Further the illumination source 102 can be operable to emit modulated light, such as intensity modulated light as implemented in time-of-flight applications. The light of a particular range of wavelengths 104 is emitted from the illumination source 102 with a first intensity distribution 105 over a first illumination area 106. Both first intensity distribution 105 and first illumination area 106 can define a first centroid 107. The illumination module 100A further includes a illumination axis 108. In one example, the illumination source 102 can be implemented as an array of discrete VCSELS. The discrete VCSELS in this example can be configured such that each discrete VCSEL emits the light of a particular range of wavelengths 104 with a similar intensity, and the array of discrete VCSELS can be distributed evenly over the first illumination area 106. Accordingly, in such an example, the first intensity distribution 105 is substantially homogenous. In another example, the illumination source 102 can be implemented as above; however, the array of discrete VCSELS may not be distributed evenly over the first illumination area 106. Accordingly, in such an example, the first intensity distribution 105 can be substantially heterogeneous. Various advantages can be conferred with respect to either the homogenous or heterogeneous first intensity distribution 105; however, the advantages of both are apparent to a person skilled in the art to which this discloser pertains. Further, the illumination source 102 can be characterized by an aperture. In some examples, the aperture can be from 0.1 to 0.3, while in other examples the aperture can be larger or smaller. On other example, for example when the illumination source 102 is implemented as an array of discrete light sources, each discrete light source can be characterized by an aperture as described above. Further, each discrete illumination source can be configured differently (e.g., with a different aperture and/or emission angle).

The illumination module 100A further includes and a collimation assembly 109. The collimation assembly 109 can include one or more optical elements (e.g., refractive, diffractive optical elements, and/or an array or combination of any of the aforementioned). The collimation assembly 109 is operable to generate collimated light 110. In the example illumination module 100A depicted in FIG. 1A, the light of a particular range of wavelengths 104 generated from the illumination source 102 can be incident on the collimation assembly 109, the collimation assembly 109 thereby producing collimated light 110. The collimated light 110 can be incident on a translation assembly 111. The translation assembly 111 can include a plurality of optical elements and/or reflective surface (e.g., refractive, diffractive optical elements, prisms, mirrors and/or any combination or an array of any of the aforementioned). The collimated light 110 incident on the translation assembly 111 can be translated thereby generating translated light 112. The translated light 112 can have a second intensity distribution 113 over a second illumination area 114. The second intensity distribution 113 and the second illumination area 114 can define a second centroid 115. The illumination module 100A further includes a mask assembly 116. The mask assembly 116 can includes elements for modifying the second intensity distribution 113 and/or second illumination area 114 of the translated light 112 incident on the mask assembly 116. In some implementations, the second illumination area 114 can be incident on the mask assembly 116. Accordingly, the mask assembly 116 can transmit the translated light 112 in the form of mask light 117. That is, translated light 112 incident on the mask assembly 116 (over the second illumination area 114) can be modified such that the mask light 117 can have a third intensity distribution 118 over a third illumination area 119. The third intensity distribution 118 and the third illumination area 119 can define a third centroid 120. The illumination source 102, the collimation assembly 109, the translation assembly 111, and the mask assembly 116 can be mounted in a housing 121. The housing 121 can be composed of a material that is substantially non-transparent to the light of a particular range of wavelengths 104 generated form the illumination source 102. For example, the housing 121 can be composed of epoxy with a non-transparent organic (such as carbon black) or inorganic filler material.

FIG. 1B depicts another example of an illumination module. The illumination module 100B includes all components as described above with respect to the illumination module 100A as depicted in FIG. 1A; however, the position of the collimation assembly 109 and the position of the translation assembly 111 are transposed. Accordingly, the light of a particular range of wavelengths 104 generated by the illumination source 102 is incident on the translation assembly 111. The translation assembly 111 generates translated light 112, where the translated light 112 is incident on the collimation assembly 109. The collimation assembly 109 generates collimated light 110, and the collimated light 110 is incident on the mask assembly 116. Various advantages can be conferred with respect to either the arrangement of the collimation assembly 109 and the translation assembly 111; however, the advantages of both are apparent to a person skilled in the art to which this discloser pertains.

Figure 2A:
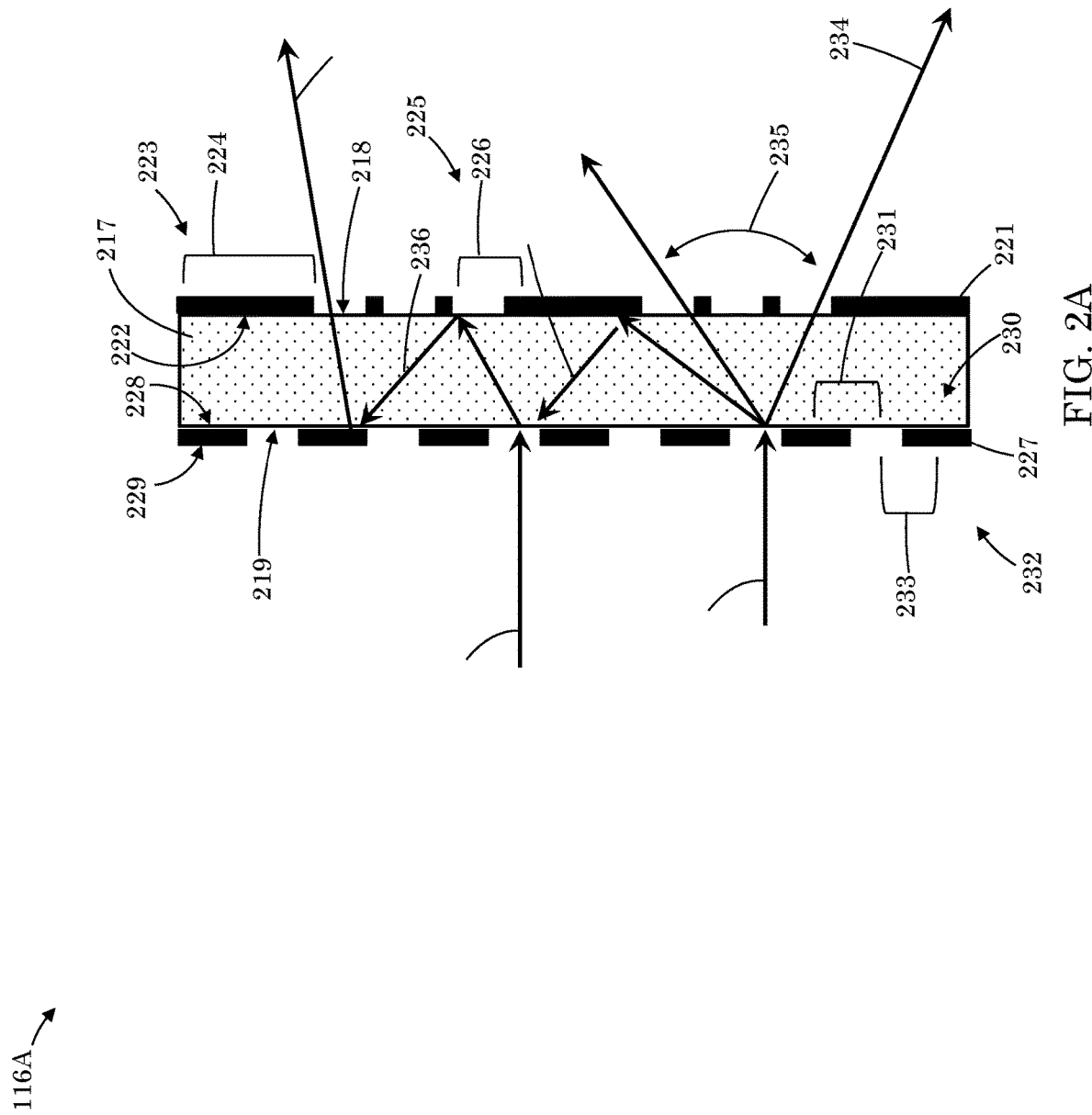
FIGS. 2A-2B depict two example mask assemblies operable to generate mask light.
Figure 2B:
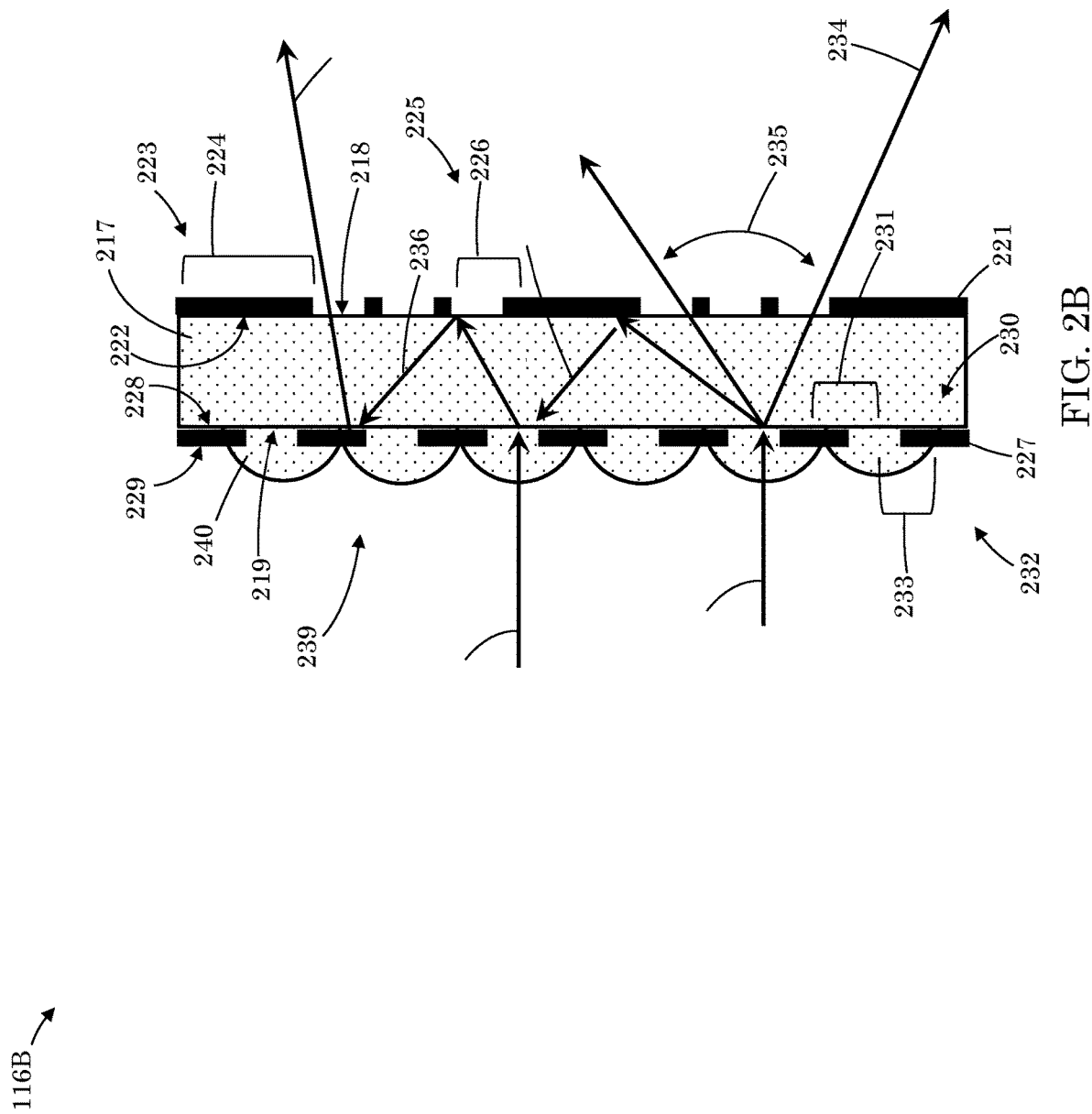

FIGS. 2A-2B depict two example mask assemblies operable to generate mask light. FIG. 2A depicts a first example mask assembly 116A. The first example mask assembly 116A can be implemented in, for example, the illumination module 100A or the illumination module 100B as depicted in FIG. 1A and FIG. 1B. The first example mask assembly 116A includes a mask substrate 217. The mask substrate 217 includes a first surface 218 and a second surface 219. Further, the mask substrate 217 can be substantially transparent to light of a particular range of wavelengths, for example the light of a particular range of wavelengths 104 as generated from the illumination source 102 as implemented in the above examples (as depicted in FIG. 1A, FIG. 1B). The first example mask assembly 116A further includes a mask layer 221. The mask layer 221 includes a mask surface 222 in contact with the first surface 218 of the mask substrate 217. The mask surface 222 defines a plurality of first mask-layer regions 223. Each first mask-layer region 224 within the plurality of first mask-layer regions 223 can be substantially non-transparent to the particular range of wavelengths described above. Further, the mask surface 222 defines a plurality of second mask-layer regions 225. Each second mask-layer regions 226 within the plurality of second mask-layer regions 225 can be substantially transparent to the particular range of wavelengths of light described above. Further, the mask surface 222 defining the plurality of first mask-layer regions 223 can be substantially reflective to the particular range of wavelengths of light described above. The plurality of first mask-layer regions 223 and the plurality of second mask-layer regions 225 can be implemented as an array of holes (e.g., the plurality of second mask-layer regions 225) and the region of material of the mask surface 222 that define the peripheral edges of the holes (e.g., the plurality of first mask-layer regions 223). Other examples of the plurality of first mask-layer regions 223 and plurality of second mask-layer regions 225 are within the scope of the appended claims, however. For example, the mask surface 222 can include a series of slits (e.g., the plurality of second mask-layer regions 225) and the region of material of the mask surface 222 that define the peripheral edges of the slits (e.g., the plurality of first mask-layer regions 223).

The first example mask assembly 116A further includes a reflection layer 227. The reflection layer 227 includes a first reflection surface 228 in contact with the second surface 219 of the mask substrate 217. The reflection layer 227 further includes a second reflection surface 229. The first reflection surface 228 defines a plurality of first reflection-layer regions 230. Each first reflection-layer region 231 within the plurality of first reflection-layer regions 230 can be substantially non-transparent to the particular range of wavelengths of light described above. Further, the first reflection surface 228 defines a plurality of second reflection-layer regions 232. Each second reflection-layer region 233 within the plurality of second reflection-layer regions 232 can be substantially transparent to the particular range of wavelengths of light described above. Further, the first reflection surface 228 defining the plurality of first reflection-layer regions 230 can be substantially reflective to the particular range of wavelengths of light as described above. The plurality of first reflection-layer regions 230 and the plurality of second reflection-layer regions 232 can be implemented as an array of holes (e.g., the plurality of second reflection-layer regions 232) and the material defining the peripheral edges of the holes (e.g., the plurality of first reflection-layer regions 230). In the example implementation depicted in FIG. 2A, light of a particular range of wavelengths, as described above, is incident on the first example mask assembly 116A. Light directly transmitted without reflection 234, is depicted in FIG. 2A. The light directly transmitted without reflection 234 can, in some implementations, be characterized by an emission angle 235. Further, light can be reflected 236 internally (that is, redirected) within the mask substrate 217. A portion of the reflected light 236 can be transmitted after reflection through the plurality of second mask-layer regions 225. However, a smaller portion of the reflected light 236 can be transmitted after reflection through the plurality of second reflection-layer regions 232. In some cases the portion of reflected light 236 transmitted through the plurality of second reflection-layer regions 232 can be as little as 10% the portion of reflected light 236 transmitted through the plurality of second mask-layer regions 225.

FIG. 2B depicts another example of a mask assembly. A second example mask assembly 116B includes all components as described above with respect to the first example mask assembly 116A as depicted in FIG. 2A; however, the second example mask assembly 116B further includes a microlens array 239. Each microlens 240 within the microlens array 239 can be operable to focus light of a certain angle of incidence to a certain emission angle. Each microlens 240 can be characterized by an aperture. In some example, the aperture can be from 0.1 to 0.3, while in other examples each aperture can be larger or smaller. Further, each microlens 240 can be configured differently (e.g., with a different aperture and/or emission angle, or can be configured with a different focal length). In general, each microlens 240 can be disposed over a respective second reflection-layer region 233. Each microlens 240 can configured to focus light through a respective second reflection-layer region 233 such that the lateral dimension of each first reflection-layer region 231 can be made as large as possible such that little reflected 236 is transmitted through the plurality of second reflection-layer regions 232.

Figure 3:
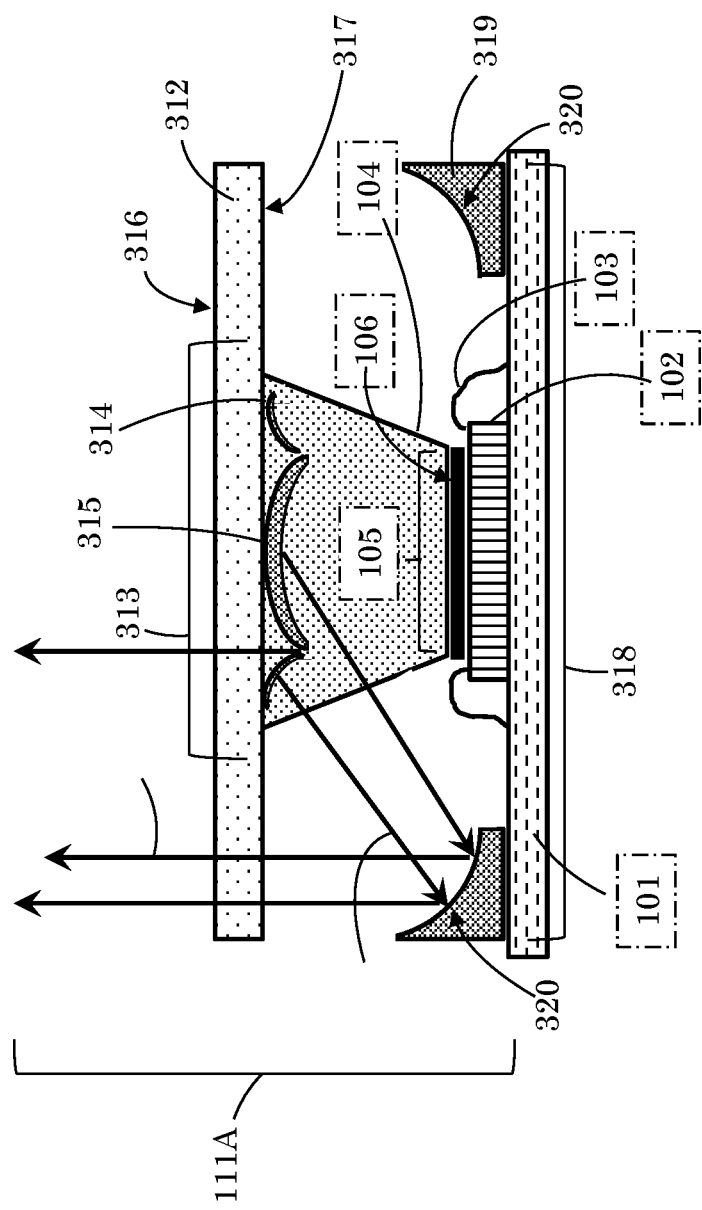
FIG. 3 depicts an example of a translation assembly.

FIG. 3 depicts an example of a translation assembly. A first example translation assembly 111A includes a translation assembly substrate 312. The translation assembly substrate 312 includes a first translation assembly substrate surface 316 and a second translation assembly substrate surface 317. The translation assembly substrate 312 is substantially transparent to the light of the particular wavelength generated by the illumination source as described above. The first example translation assembly 111A further includes a plurality of first reflective elements 313 mounted on the second translation assembly substrate surface 317. Each first reflective element 314 within the plurality of first reflective elements 313 includes a respective first reflective surface 315. Each first reflective element 314 can be implemented with any number of optical elements and combinations, optical elements such as concave-parabolic mirrors, convex-parabolic mirrors, prisms, and refractive and/or diffractive optical elements with substantially reflective surfaces. The first example translation assembly 111A further includes a plurality of second reflective elements 318. Each second reflective element 319 within the plurality of second reflective elements 318 can include a respective second reflective surface 320. The plurality of second reflective elements 318 can be operable to reflect light reflected from the plurality of first reflective elements 313. Further, each second reflective element 319 can be implemented with any number of optical elements and combinations, optical elements such as concave-parabolic mirrors, convex-parabolic mirrors, prisms, and refractive and/or diffractive optical elements with substantially reflective surfaces. Further, the plurality of first reflective elements 313 and the plurality of second reflective elements 318 are configured such that the light of the particular wavelengths generated by the illumination, source as described above, is incident on the plurality of first reflective elements generating a first reflected light that reflects from the second reflective elements generating a second reflected light. The second reflected light is directed through the translation assembly substrate 312.

In some implementations, the first translation assembly substrate surface 316 and the second translation assembly substrate surface 317 can be configured such that they are substantially transparent to the light of the particular wavelength generated by the illumination source. However, in other implementations, the first translation assembly substrate surface 316 and/or the second translation assembly substrate surface 317 can be configured such that only light with a particular angle of incidence (generated from the illumination source) can be transmitted through the translation assembly substrate 312, first translation assembly substrate surface 316 and/or second translation assembly substrate surface 317.

Figure 4:
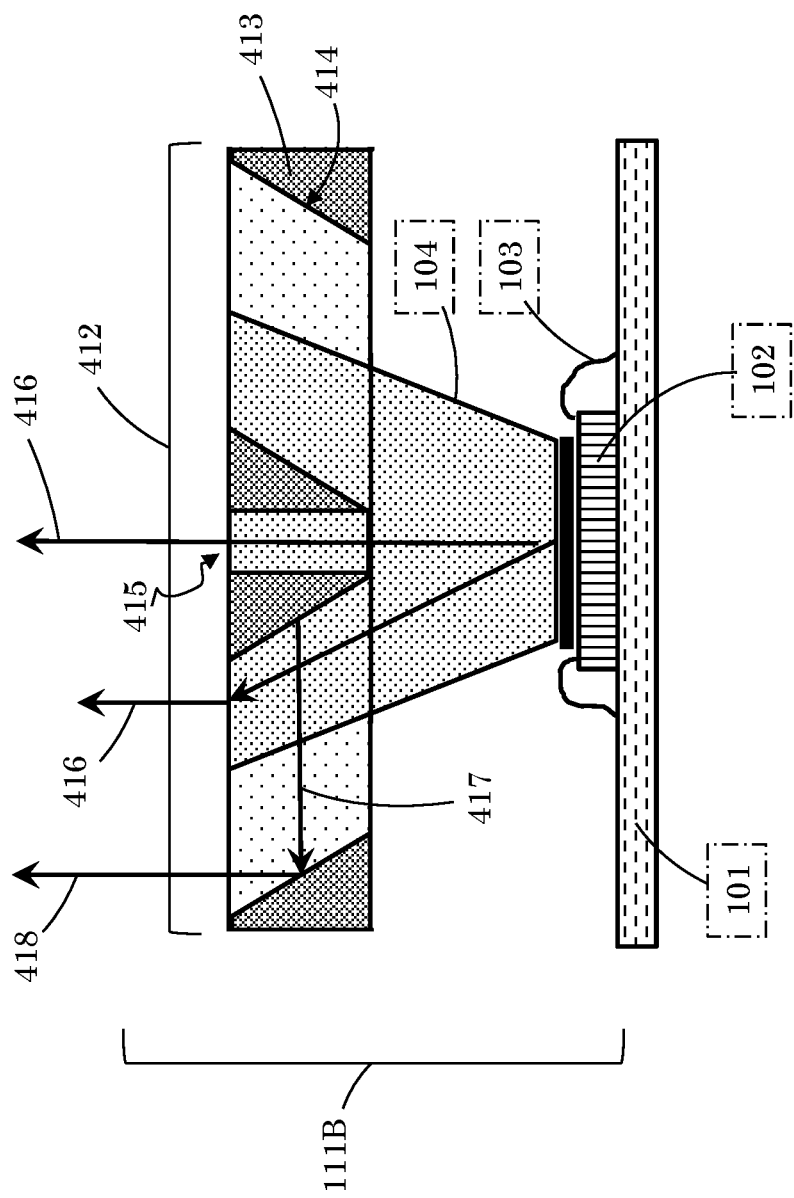
FIG. 4 depicts another example of a translation assembly.

FIG. 4 depicts another example of a translation assembly. A second example translation assembly 111B is depicted in FIG. 4. The second example translation assembly 111B includes a plurality of reflective elements 412. Each reflective element 413 within the plurality of reflective elements 412 includes a reflective surface 414. The plurality of reflective elements 412 can be operable to reflect light of a particular range of wavelengths (e.g., as generated from illumination source 102 as described above). The second example translation assembly 111B further includes a transparent region 415. The transparent region 415 can be configured such that a portion of the light, as described above, is directly transmitted without reflection 416 from any of the reflective surfaces 414. However, in other cases a portion of the light, as described above, is reflected defining a reflected light 417. The reflected light 417 can be further reflected from other reflective surfaces and transmit from the second example translation assembly 111B as light that is transmitted after reflection 418.

Figure 5:
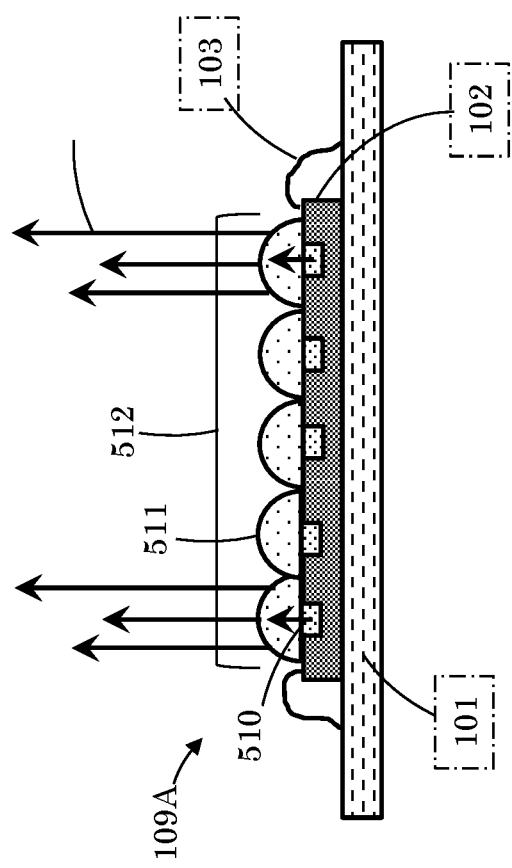
FIG. 5 depicts an example of a collimation assembly.

FIG. 5 depicts an example of a collimation assembly. A first example collimation assembly 109A is depicted in FIG. 5. The first example collimation assembly 109A can be implemented when the illumination source 102 (as described above) includes an array of discrete light sources such as a vertical-cavity surface-emitting laser 510. In such implementations, a microlens 511 can be optically disposed over a respective vertical-cavity surface-emitting laser 510. The multitude of microlens 511 a microlens array 512. In such implementations each microlens 511 can be configured to collimate the light emitted by each vertical-cavity surface-emitting laser 510. Although each microlens 511 depicted in FIG. 5 is substantially the same, in other implementations each microlens 511 can be configured differently with respect to other microlenses in the microlens array 512.

What is claimed is:

1. An illumination module, the illumination module comprising:
a substrate having electrical contacts;
an illumination source electrically connected to the substrate, wherein the illumination source is operable to generate light of a particular range of wavelengths;
the light having a first intensity distribution laterally extending over a first illumination area;
the first illumination area and the first intensity distribution defining a first centroid;
an illumination axis intersecting the first centroid of the first illumination area, wherein the illumination axis is substantially orthogonal to the first illumination area;
a collimation assembly operable to collimate the light generated from the illumination source, the collimation assembly transmitting a collimated light;
a translation assembly, operable to translate the collimated light, the translation assembly transmitting a translated light;
the translated light having a second intensity distribution laterally extending over a second illumination area;
the second illumination area and the second intensity distribution defining a second centroid;
a mask assembly, operable to transmit the translated light, the mask assembly transmitting a mask light;
the mask light having a third intensity distribution laterally extending over a third illumination area;
the third illumination area and the third intensity distribution defining a third centroid;
the collimation assembly, the translation assembly, and the mask assembly being mounted within a housing and aligned with the illumination axis, wherein the collimation assembly and the translation assembly are optically disposed between the illumination source and the mask assembly; and
wherein the second illumination area is greater than the first illumination area.

2. An illumination module according to claim 1, further comprising:
a mask substrate having a first surface and a second surface, the mask substrate being substantially transparent to light of a particular range of wavelengths;
a mask layer having a mask surface in contact with the first surface of the mask substrate, the mask surface defining a plurality of first mask-layer regions wherein each first mask-layer region is substantially non-transparent to the particular range of wavelengths and a plurality of second mask-layer regions wherein each second mask-layer regions is substantially transparent to the particular range of wavelengths, wherein the mask surface defining the first mask-layer regions is substantially reflective to the particular range of wavelengths; and
a reflection layer, having a first reflection surface in contact with the second surface of the mask substrate and a second reflection surface, the first reflection surface defining a plurality of first reflection-layer regions and a plurality of second reflection-layer regions; and
wherein each first reflection-layer region is substantially non-transparent to the particular range of wavelengths and each second reflection-layer region is substantially transparent to the particular range of wavelengths, the reflection surface defining the plurality of first reflection-layer regions being substantially reflective to the particular range of wavelengths.

3. The illumination module of claim 2, wherein the plurality of first and second mask-layer regions are regularly distributed over the mask surface.

4. The illumination module of claim 2, wherein the plurality of first and second mask-layer regions are irregularly distributed over the mask surface.

5. The illumination module of claim 2, wherein the plurality of first and second reflection-layer regions are regularly distributed over the mask surface.

6. The illumination module of claim 2, wherein the plurality of first and second reflection-layer regions are irregularly distributed over the mask surface.

7. An illumination module according to claim 1, further comprising:
- a translation assembly substrate having a first translation assembly substrate surface and a second translation assembly substrate surface, wherein the translation assembly substrate is substantially transparent to the light of the particular wavelength generated by the illumination source;
- a plurality of first reflective elements mounted on the second translation assembly substrate surface, wherein each first reflective element within the plurality of first reflective elements includes a respective first reflective surface;
- a plurality of second reflective elements, wherein each second reflective element within the plurality of second reflective elements includes a respective second reflective surface, the plurality of second reflective elements being operable to reflect light reflected from the plurality of first reflective elements; and
- wherein the light of the particular wavelengths generated by the illumination source is incident on the plurality of first reflective elements generating a first reflected light that reflects from the second reflective elements generating a second reflected light.

8. The illumination module of claim 7, wherein the first reflective elements are convex-parabolic mirrors.

9. The The illumination module of claim 7, wherein the second reflective elements are concave-parabolic mirrors.

10. The illumination module of claim 7, wherein the first and second translation substrate surfaces are substantially transparent to the light of the particular wavelength generated by the illumination source.

11. The illumination module of claim 7, wherein the first and second translation substrate surfaces are operable to transmit the light of the particular wavelength generated by the illumination source having a particular angle of incidence.

12. An illumination module according to claim 1, further comprising:
- a plurality of reflective elements, each reflective element within the plurality of reflective elements having a respective reflective surface;
- wherein the light of the particular wavelengths generated by the illumination source is incident on the plurality of reflective elements, the light incident on the plurality of reflective elements being a portion of the translated light.

13. The illumination module of claim 12, wherein the plurality of reflective elements further comprises transparent regions that are substantially transparent to light of the particular wavelength generated by the illumination source; the light incident on the transparent regions being a portion of the translated light.

14. An illumination module as in claim 1, in which the collimation assembly further includes refractive and/or diffractive optical elements.

15. An illumination module as in claim 1, in which the illumination source comprises an array of discrete light sources, wherein a collimating lens is disposed with respect to each light source of the array of discrete light sources.

16. An illumination module as in claim 1, in which the illumination source further comprises an array of discrete illumination sources, each discrete illumination source having a first numerical aperture.

17. An illumination module as in claim 1, in which the first intensity distribution laterally extending over the first illumination area is homogeneously distributed.

18. An illumination module as in claim 1, in which the first intensity distribution laterally extending over the first illumination areas is heterogeneously distributed.

19. An illumination module as in claim 1, in which the portion of light generates discrete features, the discrete features being focused at a distance from the illumination module.

20. An illumination module as in claim 1, in which the collimation assembly further comprising a plurality of optical elements.

21. An illumination module as in claim 1, in which the second illumination area is incident on the mask assembly.

22. An illumination module as in claim 1, in which the second illumination area has a homogenous intensity distribution over the area.

23. An illumination module, the illumination module comprising:
- a substrate having electrical contacts;
- an illumination source electrically connected to the substrate, wherein the illumination source is operable to generate light of a particular range of wavelengths;
- the light having a first intensity distribution laterally extending over a first illumination area;
- the first illumination area and the first intensity distribution defining a first centroid;
- an illumination axis intersecting the first centroid of the first illumination area, wherein the illumination axis is substantially orthogonal to the first illumination area;
- a translation assembly, operable to translate the light generated from the illumination source, the translation assembly transmitting a translated light;
- a collimation assembly operable to collimate the translated light, the collimation assembly transmitting a collimated light;
- the collimated light having a second intensity distribution laterally extending over a second illumination area;
- the second illumination area and the second intensity distribution defining a second centroid;
- a mask assembly, operable to transmit the translated light, the mask assembly transmitting a mask light;
- the mask light having a third intensity distribution laterally extending over a third illumination area;
- the third illumination area and the third intensity distribution defining a third centroid;
- the collimation assembly, the translation assembly, and the mask assembly being mounted within a housing and aligned with the illumination axis, wherein the collimation assembly and the translation assembly are optically disposed between the illumination source and the mask assembly; and wherein the second illumination area is greater than the first illumination area.

* * * * *